United States Patent
Sato et al.

(10) Patent No.: US 6,652,962 B1
(45) Date of Patent: *Nov. 25, 2003

(54) RESIN-COATED COMPOSITE FOIL, PRODUCTION AND USE THEREOF

(75) Inventors: Tetsuro Sato, Saitama (JP); Tsutomu Asai, Ageo (JP); Kenichiro Iwakiri, Ageo (JP)

(73) Assignee: Mitsui Mining & Smelting Co. Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/320,765

(22) Filed: May 27, 1999

(30) Foreign Application Priority Data

May 29, 1998 (JP) ............................................. 10-166199
May 18, 1999 (JP) ............................................. 11-136998

(51) Int. Cl.⁷ .............................. B32B 7/36; B32B 7/12; B32B 15/08
(52) U.S. Cl. ...................... 428/352; 428/674; 428/418; 428/901; 106/38.22; 106/38.27
(58) Field of Search ................................. 428/416, 418, 428/674, 675, 615, 901, 344, 352; 106/38.22, 38.23, 38.24, 38.27

(56) References Cited

U.S. PATENT DOCUMENTS

| 3,281,339 A | 10/1966 | Edgar et al. .................... 204/3 |
| 3,625,844 A | 12/1971 | McKean ....................... 204/140 |

(List continued on next page.)

FOREIGN PATENT DOCUMENTS

| EP | 0 148 602 A | 7/1985 |
| EP | 0 741 505 A | 11/1996 |
| EP | 0 744 884 A | 11/1996 |
| JP | 55146741 A | * 11/1980 |
| JP | 02001789 A | * 1/1990 |
| JP | 04-196389 | 7/1992 |
| JP | 05148346 A | * 6/1993 |
| JP | 08070185 A | * 3/1996 |
| JP | 09-036550 | 2/1997 | ............ H05K/3/46 |
| JP | 11-005828 | 1/1999 | ........... C08G/59/62 |
| JP | 2000008064 | * 1/2000 |

OTHER PUBLICATIONS

Abstract/Copper Foil With Adhesive And Manufacture Of Copper–Clad Laminated Board For Multilayer Printed–Wiring Board Using Said Copper Foil With Adhesive, Copyright: (C) 1995, JPO.

Abstract/Multilayer Printed Wiring Board With Via Hole, Copyright: (C) 1997, JPO.

Application No. 09/039,960, filed Mar. 16, 1998, Making And Using An Ultra–Thin Copper Foil.

Application No. 09/131,160, filed Aug. 7, 1998, Composite Foil Of Aluminum And Copper.

Application No. 09/257,643, filed Feb. 25, 1999, Composite Material Used In Making Printed Wiring Boards.

(List continued on next page.)

*Primary Examiner*—Paul Thibodeau
*Assistant Examiner*—Kevin R Kruer
(74) *Attorney, Agent, or Firm*—Jenkens & Gilchrist

(57) ABSTRACT

The invention provides a resin-coated composite foil characterized in that an organic insulating layer is disposed on an ultra-thin copper foil is disposed on a supporting metal layer through an intermediate organic release layer. The resin-coated composite foil is free from the peeling or blistering between the supporting metal foil and the ultra-thin copper foil during the production of a copper clad laminate.

4 Claims, 1 Drawing Sheet

U.S. PATENT DOCUMENTS

| | | | | |
|---|---|---|---|---|
| 3,674,656 A | | 7/1972 | Yates | 204/13 |
| 3,869,394 A | * | 3/1975 | Daniels et al. | 252/46.7 |
| 3,873,637 A | * | 3/1975 | Fujiwara et al. | 428/415 |
| 3,936,575 A | * | 2/1976 | Watanabe et al. | 428/417 |
| 3,984,598 A | * | 10/1976 | Sarazin et al. | 428/336 |
| 3,998,601 A | | 12/1976 | Yates et al. | 29/195 |
| 4,113,576 A | | 9/1978 | Hutkin | 204/13 |
| 4,160,069 A | * | 7/1979 | Johnson et al. | 429/104 |
| 4,309,293 A | * | 1/1982 | Braid | 252/48.2 |
| 4,398,993 A | | 8/1983 | Hume, Jr. et al. | 156/643 |
| 4,425,248 A | * | 1/1984 | Piotrowski et al. | 252/49.3 |
| 4,604,160 A | * | 8/1986 | Murakami et al. | 158/150 |
| 5,133,888 A | * | 7/1992 | Waynick | 252/33.4 |
| 5,405,915 A | * | 4/1995 | Hess et al. | 525/290 |
| 5,419,946 A | * | 5/1995 | Takanezawa et al. | 427/306 |
| 5,707,729 A | * | 1/1998 | Satoh | 428/344 |
| 5,916,939 A | * | 6/1999 | Gillis et al. | 524/218 |
| 5,959,256 A | * | 9/1999 | Saida et al. | 174/258 |
| 5,965,245 A | * | 10/1999 | Okano et al. | 428/209 |
| 5,976,699 A | * | 11/1999 | Hosomi et al. | 428/418 |
| 6,187,416 B1 | * | 2/2001 | Satoh et al. | 174/258 |
| 6,270,889 B1 | * | 8/2001 | Kataoka et al. | 156/289 |
| 6,319,620 B1 | * | 11/2001 | Kataoka et al. | 174/255 |
| 6,346,335 B1 | * | 2/2002 | Chen et al. | 428/336 |

OTHER PUBLICATIONS

Application No. 09/186,830, filed Nov. 5, 1998, Resin Composition For Copper–Clad Laminate, Resin–Coated Copper Foil, Multilayered Copper–Clad Laminate, And Multilayered Printed Circuit Board.

Application No. 09/220,245, filed Dec. 23, 1998, Making And Using An Ultra–Thin Copper Foil.

* cited by examiner

RESIN-COATED COMPOSITE FOIL, PRODUCTION AND USE THEREOF

FIELD OF THE INVENTION

The present invention relates generally to a resin-coated composite foil. More particularly, the invention relates to a resin-coated composite foil which can suitably be employed in the production of high-density printed wiring boards, a process for producing the resin-coated composite foil, and processes for using the foil in producing multilayer copper-clad laminates and multilayer printed wiring baords.

BACKGROUND OF THE INVENTION

Laminates for printed wiring board used in electronic materials are commonly produced by impregnating a glass cloth, a kraft paper, a glass nonwoven fabric or the like with a thermosetting resin such as a phenolic resin or an epoxy resin, semicuring the thermosetting resin to thereby obtain a prepreg and laminating one side or both sides of the prepreg with a copper foil. Further, multilayer printed wiring boards are commonly produced by forming wirings on both sides of a copper-clad laminate to thereby obtain an inner core material and laminating both sides of the inner core material, through the medium of prepregs, to additional copper foils.

In recent years, it has been common to furnish multilayer printed wiring boards with small holes between layers, i.e., via holes in conformity with the increase of the density of printed wiring board. Such via holes can be formed by, for example, laser beams or plasma machining. Results with laser beams or plasma machining are poor when prepregs containing an inorganic component such as glass fiber are used as an insulation layer. Therefore, only resins containing no inorganic component are increasingly used for the insulation layer. Accordingly, for example, a resin film composed of a semicured thermosetting resin or a resin-coated composite foil obtained by applying a resin to one side of a copper foil and semicuring the resin is used for the insulation layer.

Printed wiring boards are produced by laminating such a resin film or resin-coated composite foil onto a printed wiring board furnished with wirings (inner core material) and then forming wirings and via holes. The thus obtained laminates possess heat resistance, electrical properties and chemical resistance that are satisfactory in practical use as printed wiring board.

Although the current copper foil used in the resin-coated copper foil is generally an electrolytic copper foil having a thickness of 12 to 35 $\mu$m, the use of a thinner copper foil is required when it is intended to provide more minute wirings, i.e. having very small wiring lines and spaces. However, resin-coated copper foils produced by applying a resin varnish to an ultra-thin copper foil having a thickness of 12 $\mu$m or less and heating and drying the same have various drawbacks.

For example, it is very likely for the copper foil to be broken during the coating, heating or drying step, thereby rendering stable production difficult. Another problem is that the applied resin layer shrinks during the drying step to thereby increase the likelihood of deformation of the resin-coated copper foil, namely curling thereof, with the result that the handling of the resin-coated copper foil is very difficult. A further problem resides in that the resin composition for use in the resin-coated copper foil must be as proposed by the inventors (Japanese Patent Application No. Hei 9-176565) in order to prevent cracking of the resin layer, thereby restricting the resin blend formulation. There is still a further problem such that, when ultra-thin copper foils and inner wirings are combined to construct a multilayer board, the ultra-thin copper foils are broken or wrinkled by the unevenness of a surface of the inner wirings.

The method of interposing a thick copper foil or plastic film between a hot press plate and a resin-coated copper foil during the laminating step is known as a countermeasure to the above problems. Furthermore, the method of producing a resin-coated composite foil from an ultra-thin copper foil furnished with a supporting metal foil (carrier) has been proposed as described in Japanese Patent Application Publication (Unexamined) No. Hei 9-36550. Generally, either the etchable type having its support metal foil selectively removed with the use of a liquid chemical or the peelable type having it support metal foil mechanically stripped is used as the above ultra-thin copper foil furnished with the supporting metal foil.

However, the above method of interposing the thick copper foil or plastic film between the press hot plate and the resin-coated copper foil during the laminating step has drawbacks in that the cost of copper foil and plastic film are incurred and that the working efficiency is deteriorated. Further, when a plastic film is interposed, the plastic film is charged with static electricity so that dust in the working environment is likely to deposit on the surface of the plastic film. Thus, the dust is transferred to a product to thereby bring about etching failure or other problems. Moreover, the conventional production of a resin-coated composite foil from an ultra-thin copper foil furnished with the supporting metal foil has also drawbacks. Specifically, the use of the etchable type carrier creates problems in that the number of process steps is increased by the etching and disposal of etching waste liquid is required. On the other hand, the use of the peelable type carrier creates problems in that it is difficult to optimize the bonding strength between the supporting metal foil and the ultra-thin copper foil. That is, when the bonding strength is too low, although the stripping of the supporting metal foil after lamination onto a base material is facilitated, peeling is likely to occur between the supporting metal foil and the ultra-thin copper foil when, while applying the organic insulation layer, heating and drying is carried out after the application of a resin varnish. Thus, blistering of the ultra-thin copper foil and separation of the supporting metal foil and the ultra-thin copper foil from each other is likely to occur and it renders practical production difficult. In contrast, when the bonding strength between the supporting metal foil and the ultra-thin copper foil is increased, although no problems occur during the resin varnish application and heating/drying steps, it has been found that, during the step of stripping the supporting metal foil after the lamination onto the base material, stripping is difficult and the base material is deformed by stress attributed to the stripping with the result that the base material suffers from a residual strain increase and cracking and that inner wirings are broken.

When a laser is employed to provide a copper-clad laminate with via holes, a sodium hydroxide solution is used as a cleaning liquid for removing dust and other matter resulting from layer perforation. This sodium hydroxide solution corrodes the insulation resin, thereby the diameter of via holes formed in the insulation resin layer is larger than desired. On the other hand, a resin composition comprising an epoxy resin blend consisting of an epoxy resin and a curing agent therefor and a thermoplastic resin which is soluble in a solvent and has a functional group, other than an alcoholic hydroxyl group, polymerizable with epoxy resins is available as an alkali resistant resin. However, this resin composition has drawbacks in that, in the B-stage (semicured), cracking is likely to occur in the resin composition and that deformation of resin-coated copper foil during handling thereof is likely to crack the insulation resin layer. In these circumstances, the inventors have made extensive and intensive studies with a view toward solving the above problems. As a result, it has been found that the above technical problems and drawbacks of the prior art can be resolved by disposing an organic insulation layer on an ultra-thin copper foil provided on a supporting metal foil through an organic release layer. The present invention has been completed on the basis of this finding.

OBJECT OF THE INVENTION

An object of the present invention is to solve the above problems of the prior art. An object of the present invention is to provide a resin-coated composite foil which is free from the peeling of the supporting metal foil and the ultra-thin copper foil from each other even during the resin varnish coating and heating/drying steps and which permits extremely easy stripping of the supporting metal foil after the lamination onto a base material. A further object of the present invention is to provide a printed wiring board which has excellent workability in laser and plasma machining and can be made with fine wirings and via holes. Another object of the present invention is to provide processes for producing a multilayer copper-clad laminate and a multilayer printed wiring board with the use of the resin-coated composite foil having high alkali resistance.

SUMMARY OF THE INVENTION

The resin-coated composite foil of the present invention comprises:

a supporting metal layer, an organic release layer disposed on a surface of the supporting metal layer, an ultra-thin copper foil disposed on the organic release layer, and an organic insulation layer disposed on the ultra-thin copper foil.

The organic insulation layer is preferably formed from a resin composition comprising:

(i) an epoxy resin blend comprising an epoxy resin and a curing agent therefor, and (ii) a thermoplastic resin which is soluble in a solvent and has a functional group, other than an alcoholic hydroxyl group, polymerizable with the epoxy resin. This thermoplastic resin is preferably selected from the group consisting of a polyvinylacetal resin, a phenoxy resin and a polyether sulfone resin.

It is preferred that the organic release layer comprises a compound selected from the group consisting of nitrogen-containing compounds, sulfur-containing compounds and carboxylic acids.

The nitrogen-containing compounds are preferably substituted triazole compounds such as carboxybenzotriazole, N',N'-bis(benzotriazolylmethyl)urea and 3-amino-1H-1,2,4-triazole.

Examples of the sulfur-containing compounds include mercaptobenzothiazole, thiocyanic acid and 2-benzimidazolethiol.

The carboxylic acids are preferably monocarboxylic acids such as oleic acid, linolic acid and linolenic acid.

The process for producing a resin-coated composite foil according to the present invention comprises the steps of:

uniformly forming an organic release layer on a supporting metal layer;

electrodepositing an ultra-thin copper foil layer on the organic release layer; and forming an organic insulation layer on the ultra-thin copper foil layer.

The process for producing a multilayer copper-clad laminate according to the present invention comprises the steps of:

superimposing a resin-coated composite foil (A) comprising a supporting metal layer, an organic release layer disposed on a surface of the supporting metal layer, an ultra-thin copper foil disposed on the organic release layer and an organic insulation layer disposed on the ultra-thin copper foil, and a copper-clad laminate (B) comprising an insulation base layer having its one side or both sides furnished with inner wiring;

wherein the organic insulation layer of the resin-coated composite foil (A) contacts the wiring furnished side of the copper clad laminate (B), followed by applying heat and pressure to thereby obtain a laminate; and stripping the supporting metal layer from the laminate.

The process for producing a multilayer printed wiring board according to the present invention comprises forming an outer wiring on the ultra-thin copper foil layer of the multilayer copper-clad laminate produced by the above process for producing a multilayer copper-clad laminate.

The outer wiring can be formed by the steps of forming via holes with the use of UV-YAG laser or carbon dioxide laser, panel plating and etching.

DETAILED DESCRIPTION OF THE INVENTION

Figure 1:
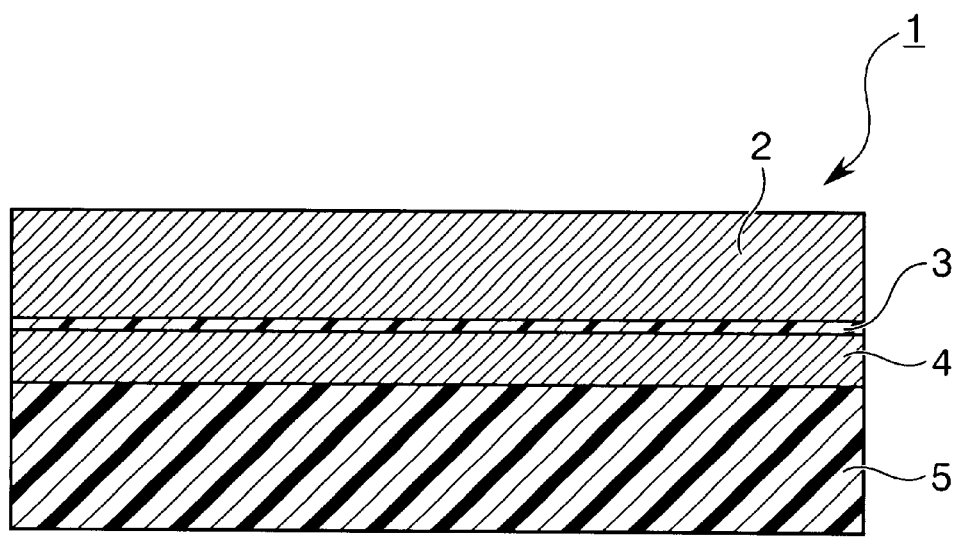
FIG. 1 is a schematic sectional view showing one embodiment of the resin-coated composite foil of the present invention.

The resin-coated composite foil of the present invention will be described in detail below.

The resin-coated composite foil of the present invention comprises:

a supporting metal layer, an organic release layer disposed on a surface of the supporting metal layer, an ultra-thin copper foil disposed on the organic release layer, and an organic insulation layer disposed on the ultra-thin copper foil.

FIG. 1 is a schematic sectional view showing one embodiment of the resin-coated composite foil of the present invention. Referring to FIG. 1, in this embodiment of the resin-coated composite foil 1, an organic release layer 3 and an ultra-thin copper foil 4 are disposed in this order on a supporting metal layer 2. Further, an organic insulation layer 5 is disposed on the ultra-thin copper foil 4.

The supporting metal layer 2 is preferably composed of copper or a copper alloy because the organic release layer 3 for use in the present invention forms a chemical bond with copper. The use of copper or a copper alloy is further advantageous in that the supporting metal layer after stripping can be recycled as a raw material for copper foil production. The supporting metal layer 2 can also be composed of a material other than the copper and copper alloy, for example, copper-plated aluminum. The thickness of the supporting metal layer 2 is not particularly limited, and the supporting metal layer 2 may be, for example, a foil having a thickness of 10 to 18 µm. When the supporting metal layer 2 is relatively thin, it may be referred to as a foil. However, the thickness of the supporting metal layer 2 may be larger than that of common foil, and use can be made of, for example, a thicker supporting sheet of about 5 mm or less thickness.

In the present invention, the organic release layer 3 is preferably composed of an organic compound selected from the group consisting of nitrogen-containing compounds, sulfur-containing compounds and carboxylic acids.

The nitrogen-containing compounds are preferably nitrogen-containing compounds having a substituent (functional group). Of these, triazole compounds having a substituent (functional group) such as carboxybenzotriazole (CBTA), N',N'-bis(benzotriazolylmethyl)urea (BTD-U) and 3-amino-1H-1,2,4-triazole (ATA) are especially preferred.

Examples of the sulfur-containing compounds include mercaptobenzothiazole (MBT), thiocyanic acid (TCA) and 2-benzimidazolethiol (BIT).

The carboxylic acids are, for example, high-molecular-weight carboxylic acids. Of these, monocarboxylic acids, for example, fatty acids derived from animal or plant fats and oils are preferred. The fatty acids may be saturated fatty acids or unsaturated fatty acids such as oleic acid, linolic acid and linolenic acid.

The organic release layer 3 composed of the above organic compounds prevents peeling of the supporting metal layer 2 and the ultra-thin copper foil 4 from each other and enables very easy stripping of the supporting metal layer 2 after the lamination onto a base material.

The ultra-thin copper foil 4 for use in the resin-coated composite foil 1 of the present invention has a thickness of 12 µm or less, preferably 5 µm or less. When the copper foil has a thickness of greater than 12 µm, it can be handled without the aid of the supporting metal layer.

The organic insulation layer 5 for use in the resin-coated composite foil 1 of the present invention can be composed of a material which is not particularly limited as long as it is an insulation resin commercially available for electrical and electronic uses. However, insulation resins which are excellent in alkali resistance are preferred because alkali solutions are used for cleaning via holes after laser perforation.

An insulation resin composition comprising:
(i) an epoxy resin blend comprising an epoxy resin and a curing agent therefor, and
(ii) a thermoplastic resin which is soluble in a solvent and has a functional group, other than an alcoholic hydroxyl group, polymerizable with the epoxy resin is preferably used as the above insulation resin.

A curing accelerator may be contained in the epoxy resin blend (i).

The above insulation resin composition can be used in the form of a resin varnish by dissolving it in a solvent such as methyl ethyl ketone.

The above insulation resin composition has a drawback of being readily cracked in the B-stage and, hence, it is difficult to use the resin composition for a resin layer of nonsupported resin-coated copper foil. The inventors have found that, when it is used as an organic insulation layer of supported composite foil, the deformation of copper foil during the handling thereof is reduced to thereby enable the use of the insulation resin composition.

The epoxy resin for use in the epoxy resin blend is not particularly limited as long as it is of the type useful as electrical and electronic materials. Examples of suitable epoxy resins include bisphenol A epoxy resin, bisphenol F epoxy resin, novolak epoxy resin, cresol novolak epoxy resin, tetrabromobisphenol resin and glycidylamine epoxy resin. From the viewpoint of being used in the resin-coated composite foil in the present invention, a curing agent which has low activity at room temperature but induces curing upon being heated, namely a latent curing agent, is suitable to the curing of the epoxy resins. For example, dicyandiamide, an imidazole, an aromatic amine, phenol novolak resin or cresol novolak resin is used as the latent curing agent. The epoxy resin blend (i) may contain a curing accelerator for accelerating the reaction between the epoxy resin and the curing agent therefor. For example, a tertiary amine or an imidazole can be used as the curing accelerator.

Preferably, the epoxy resin blend (i) is mixed in an amount of 95 to 50 parts by weight, relative to 100 parts by weight of the total amount of the insulation resin composition for use in the present invention. When the amount of mixed epoxy resin blend (i) in the insulation resin composition is less than 50 parts by weight, the adherence to a base material such as FR-4 may be decreased. On the other hand, when the amount is greater than 95 parts by weight, it is very likely for the resin layer to break even when the resin-coated copper foil has a supporting metal layer in combination, thereby rendering the handleability thereof extremely poor.

The thermoplastic resin (ii) which is soluble in a solvent and has a functional group, other than an alcoholic hydroxyl group, polymerizable with the epoxy resin is preferably selected from the group consisting of polyvinylacetal resins, phenoxy resins and polyether sulfone resins. These thermoplastic resins may be used in combination.

The above thermoplastic resin (ii) can be used in the form of a varnish by dissolving it in a solvent such as methyl ethyl ketone and combining the solution with the epoxy resin blend.

Generally, the reactivity of the epoxy resin with an alcoholic hydroxyl group is so low that it is difficult to crosslink a thermoplastic resin having only an alcoholic hydroxyl group as a reactive functional group with the epoxy resin. Thus, mixing a thermoplastic resin having only an alcoholic hydroxyl group as a reactive functional group with the epoxy resin may invite lowering of water and heat resistances, so that the mixture thereof is not suitable to the use as a material for printed wiring board. As the reactive functional group other than an alcoholic hydroxyl group, there can be mentioned, for example, a phenolic hydroxyl group, a carboxyl group and an amino group. When use is made of the thermoplastic resin having any of these functional groups, the thermoplastic resin and the epoxy resin are easily crosslinked with each other at the time of curing to thereby enable avoiding the above problems (lowering of heat and water resistances). It is preferred to use 5 to 50 parts by weight of the thermoplastic resin having a functional group, other than an alcoholic hydroxyl group, polymerizable with the epoxy resin, relative to 100 parts by weight of the total amount of the insulation resin composition. When the amount of the thermoplastic resin having a functional group, other than an alcoholic hydroxyl group, polymerizable with the epoxy resin is less than 5 parts by weight, the fluidity of the resin composition is so high that, unfavorably, the thickness of the insulation resin layer of a laminate after press forming is likely to become uneven. On the other hand, when the amount exceeds 50 parts by weight, the degree of shrinkage of the insulation resin layer is so large at the time of cooling after drying that the deformation (curling) of the resin-coated composite foil is likely to occur whereby the supporting metal layer and the ultra-thin copper foil may be separated from each other. Thus, stable production may be hampered.

This organic insulation layer may further contain other resin components such as a thermosetting polyimide resin, a urethane resin, a phenolic resin or a phenoxy resin within such an extent that the gist of the present invention is not departed from. The addition of these resin components enables enhancing, for example, flame resistance and resin fluidity.

This organic insulation layer is in the state of being partially cured, or semicured (B-stage). When the organic insulation layer is in the above state, the resin fluidity exhibited at the time of lamination and the easiness of embedding inner wiring therein can be controlled. Although the thickness of the organic insulation layer is not particularly limited, it is preferred that the organic insulation layer have a thickness of about 30 to 100 μm for ensuring the easy embedding of inner wirings and sufficient insulation.

The process for producing a resin-coated composite foil according to the present invention will now be described.

The process for producing a resin-coated composite foil according to the present invention comprises the steps of:

uniformly forming an organic release layer on a supporting metal layer;

electrodepositing an ultra-thin copper foil layer on the organic release layer; and forming an organic insulation layer on the ultra-thin copper foil layer.

In the present invention, first, an organic release layer is formed on a supporting metal layer. Prior to the formation of the organic release layer, any oxide film formed on the surface of the supporting metal layer may be removed by acid washing and water washing.

The organic release layer may be formed by the immersion method, the coating method or any other method capable of forming a uniform layer on a supporting member. For example, in the immersion method, the supporting metal layer is immersed in an aqueous solution of an organic compound such as a triazole so that the organic release layer is formed thereon. The concentration of aqueous solution is preferably in the range of 0.01 to 10 g/L, still preferably 0.1 to 10 g/L. The immersion time is preferably in the range of 5 to 60 sec. Although the effect of the formed organic release layer is not diminished by the increase of the concentration and the prolongation of the immersion time, these are not desirable from the economic and productive viewpoints. It is preferred that any excess adhering matter be washed away with water after the taking out of the supporting member from the solution so that only a very thin organic release layer remains on the surface of the supporting member. It is satisfactory if the thickness of the organic release layer after washing is generally in the range of 30 to 100 Å, especially 30 to 60 Å.

Subsequently, an ultra-thin copper foil layer is formed on the thus formed organic release layer. The ultra-thin copper foil layer is electrodeposited on the organic release layer disposed on the supporting metal layer with the use of a plating bath. The electrodeposition of copper can be effected by the use of, for example, a copper pyrophosphate plating bath, an acidic copper sulfate plating bath or a copper cyanide plating bath. Although any of various electrodeposition baths can be applied, suitable electrodeposition bath can be selected in conformity with the particular objective.

For increasing the bonding between the ultra-thin copper foil layer and an organic insulation layer formed thereon, an adhesion promoting treatment may be applied to the outer surface of the ultra-thin copper foil by using known methods, for example, a roughening treatment (nodulation) in which a multitude of conductive fine particles are electrodeposited on the foil surface by regulating electrodeposition conditions. An example of the roughening treatment is disclosed in, for example, U.S. Pat. No. 3,674,656. Further, the surface of the ultra-thin copper foil which may be subjected to the roughening treatment may be passivated for preventing the oxidation of the ultra-thin copper foil. The passivation may be carried out alone or may be preceded by roughening treatment. The passivation is generally effected by electrodepositing a member selected from the group consisting of zinc, zinc chromate, nickel, tin, cobalt and chromium on the surface of the ultra-thin copper foil. An example of passivation is disclosed in U.S. Pat. No. 3,625,844.

Thereafter, an organic insulation layer is formed on the surface of the ultra-thin copper foil.

The method of forming the organic insulation layer is not particularly limited. For example, the organic insulation layer can be formed by application of a resin varnish obtained by combining the above epoxy resin blend (i) with a solution of the above thermoplastic resin (ii) in a dissolving solvent.

The dissolving solvent is not particularly limited. For example, methyl ethyl ketone is used as the dissolving solvent. The proportion of added dissolving solvent to the thermoplastic resin (ii) is not particularly limited as long as the resultant resin varnish has a viscosity suitable for coating.

The resin-coated composite foil can generally be obtained by carrying out heating and drying after the formation of the organic insulation layer. The heating and drying conditions are not particularly limited and can be determined depending on the resin formulation of employed insulation resin composition and the type of employed solvent, although heating at 130 to 200° C. for 1 to 10 min is preferred from the viewpoint of productivity and solvent recovery efficiency.

When these heating and drying conditions are employed, the organic insulation layer is in the state of being partially cured, namely semicured (B-stage), so that the resin fluidity and embedding of internal-layer wirings at lamination can be controlled.

A multilayer copper-clad laminate can be produced by a process comprising the steps of:

Superimposing the above obtained resin-coated composite foil (A) and a copper-clad laminate (B) comprising an insulation base layer having its one side or both sides furnished with inner wirings, so as to make the organic insulation layer of the resin-coated composite foil (A) contact the wiring side of the copper clad laminate (B), followed by application of heat and pressure to thereby obtain a laminate; and stripping the supporting metal layer so that the supporting metal layer is separated from the laminate by virtue of the presence of the organic release layer.

Any resin base materials commonly used in electronic device applications can be employed as the insulation base layer without any particular limitation, which include, for example, FR-4 (glass fiber reinforced epoxy), paper/phenolic and paper/epoxy base materials.

The lamination of the copper-clad laminate with the resin-coated composite foil is carried out by heating under pressure according to the press forming or roll lamination technique. As a result, the semicured organic insulation layer is fully cured.

A multilayer printed wiring board can be produced by, after the stripping of the supporting metal layer to expose the ultra-thin copper foil on the surface of the multilayer copper-clad laminate, drilling the multilayer copper-clad laminate to thereby form through holes and irradiating the ultra-thin copper foil layer with laser, such as UV-YAG layer or carbon dioxide laser, or plasma to form via holes, followed by panel plating and etching to thereby form wirings.

A printed wiring board with an increased number of layers can be produced by repeating these steps for producing the multilayer printed wiring board.

EFFECT OF THE INVENTION

The resin-coated composite foil of the present invention prevents the occurrence of blisters and peeling between the supporting metal layer and the ultra-thin copper foil during the production of the copper-clad laminate. Although the resin-coated composite foil is one including an ultra-thin copper foil, the handleability thereof is excellent. Further, the copper-clad laminate produced from this resin-coated composite foil is excellent in laser workability and permits easily forming fine wirings.

Moreover, in the present invention, a printed wiring board permitting formation of fine wirings and the formation of via holes by laser or plasma can be made by using a composite foil with an ultra-thin copper foil and a specific resin composition.

EXAMPLE

The present invention will now be illustrated in greater detail with reference to the following Examples, which in no way limit the scope of the invention.

Example 1

Electrolytic copper foil of 35 μm thickness was provided as a supporting metal layer. The electrolytic copper foil had a rough side (matte side) and a smooth side (shiny side). On the shiny side surface of the copper foil, an organic release layer was formed, and then was subjected to the following first copper plating, second copper plating, roughening treatment and passivation in sequence, as follows.

(A) Formation of Organic Release Layer

The electrolytic copper foil for use as a supporting metal layer was immersed in a 2 g/L carboxybenzotriazole (CBTA) solution heated at 30° C. for 30 sec, taken out from the solution and washed with water. Thus, an organic release layer of CBTA was formed.

(B) First Copper Plating

A 1 μm thick layer of copper was deposited on the surface of the organic release layer formed on the shiny side surface of the electrolytic copper foil by performing a cathodic electrolysis in a pH 8.5 copper pyrophosphate bath containing 17 g/L of copper and 500 g/L of potassium pyrophosphate heated at 50° C., in which a current density was 3 A/dm$^2$.

(C) Second Copper Plating

The surface of the thus formed ultra-thin copper foil was washed with water, and a 2 μm thick layer of copper was deposited thereon by performing a cathodic electrolysis in a copper sulfate bath containing 80 g/L of copper and 150 g/L of sulfuric acid heated at 50° C., in which a current density was 60 A/dm$^2$. As a result, there was obtained an ultra-thin copper foil layer having a total thickness of 3 μm.

(D) Roughening Treatment

The surface of the resultant ultra-thin copper foil layer was subjected to a conventional roughening treatment.

(E) Passivation

The treated side surface of the ultra-thin copper foil layer was passivated with zinc chromate by the conventional method. Thus, a composite copper foil was obtained.

The surface of ultra-thin copper foil of the thus obtained composite copper foil was coated with a 80 μm thick (in terms of solid contents) layer of the insulation resin composition of the following formulation and heated in an oven at 150° C. for 4 min to thereby effect solvent removal and drying. Thus, the resin was semicured to thereby produce a resin-coated composite foil. No blister and peeling occurred between the supporting copper foil and the ultra-thin copper foil layer.

1) Epoxy Resin Blend 1-(1) Epoxy Resin:

Bisphenol A epoxy resin (trade name: Epomic R-140, produced by Mitsui Chemicals, Inc.) and o-cresol novolak epoxy resin (trade name: Epo Tohto YDCN-704, produced by Tohto Kasei K.K.) were mixed together in a weight ratio of 100:100.

1-(2) Epoxy Resin Curing Agent:

1 equivalent of epoxy resin curing agent (trade name: Milex XL-225, produced by Mitsui Chemicals, Inc.) was added to the above epoxy resin mixture.

1-(3) Epoxy Resin Curing Accelerator:

1 part by weight of epoxy resin curing accelerator (trade name: Curezol 2PZ, produced by Shikoku Chemicals Corporation) was added to the above epoxy resin mixture.

The above epoxy resin mixture, epoxy resin curing agent and epoxy resin curing accelerator were dissolved in dimethylformamide to thereby obtain a 50% solution as an epoxy resin blend.

2) Thermoplastic Resin Soluble in solvent and Having Functional Group, Other Than Alcoholic Hydroxyl Group, Polymerizable With Epoxy Resin Use was made of a carboxyl modified polyvinylacetal resin (degree of polymerization of starting polyvinyl alcohol: 2400, acetal ratio: 80, acetaldehyde/butyraldehyde: 50/50 (molar ratio), hydroxyl concentration: 17% by weight, and carboxyl concentration: 1% by weight).

These components and methyl ethyl ketone were mixed together in the following proportion of Table 1, thereby obtaining a resin composition.

TABLE 1

| | Component proportion |
|---|---|
| 1) epoxy resin blend | 80 pts.wt. (in terms of solid contents) |
| 2) thermoplastic resin soluble in solvent and having functional group, other than alcoholic hydroxyl, polymerizable with epoxy resin | 20 pts.wt. |
| 3) methyl ethyl ketone | total solid contents adjusted to 30 wt. % |

Both sides of FR-4 copper-clad laminate (core thickness: 0.6 mm and copper foil thickness: 35 μm) having both sides furnished with wirings were each overlaid with the above obtained resin-coated composite foil so that the resin layer of the resin-coated composite foil contacted the FR-4 copper-clad laminate. Heating was performed at 175° C. for 60 min under a pressure of 25 kgf/cm² so that the resin layer was cured.

The laminate was cooled, and the supporting copper foils were stripped off to thereby obtain a multilayer copper-clad laminate having four conductive layers (copper foil layers). The peeling strength (measured in accordance with Japanese Industrial Standard C-6481) between the supporting copper foil and the ultra-thin copper foil was as low as 0.01 kgf/cm to thereby ensure easy stripping thereof from each other. A multilayer printed wiring board was obtained by furnishing the multilayer copper-clad laminate with via holes and wirings in the manner comprising:

1) forming via holes (hole diameter: 100 μm) by UV-YAG laser;
2) cleaning the base with a 10% NaOH solution;
3) panel plating (thickness: 12 μm); and
4) etching for wiring formation (line width/line spacing= 60 μm/60 μm).

The thus obtained multilayer printed wiring board was free from resin cracking at the time of layup. By virtue of the use of the ultra-thin copper foil, via holes could easily be formed therein by UV-YAG laser. The multilayer printed wiring board was also free from the dissolution of resin layer by the alkali cleaning liquid, enabled obtaining via holes with desired diameter and enabled forming wirings whose line width/line spacing was 60 μm/60 μm.

Examples 2–4

In exactly the same manner as in Example 1, support-bearing composite foils were produced. Specifically, three electrolytic copper foils each of 35 μm thickness were provided as supporting metal layers, and organic release layers were formed on the supporting electrolytic copper foils. 1 μm thick layers of copper were deposited on the organic release layers at the first copper plating. At the second copper plating, 4 μm thick, 8 μm thick and 11 μm thick copper layers were deposited thereon in Example 2, Example 3 and Example 4, respectively. Thus, ultra-thin copper foil layers of 5 μm, 9 μm and 12 μm total thicknesses were formed on the support-bearing composite foils in Example 2, Example 3 and Example 4, respectively.

Resin-coated composite foils, multilayer copper-clad laminates and multilayer printed wiring boards were obtained from these three support-bearing composite foils having different thicknesses in the same manner as in Example 1.

In these Examples as well, no blister and peeling occurred between the support copper foil and the ultra-thin copper foil layer. The peeling strength between support copper foil and ultra-thin copper foil was as low as 0.01 kgf/cm in Example 2, 0.01 kgf/cm in Example 3 and 0.02 kgf/cm in Example 4 to thereby ensure easy stripping thereof from each other. Moreover, in each of Examples 2–4, no resin cracking occurred at the time of layup, and via hole formation was easy. Also, wirings whose line width/line spacing was 60 μm/60 μm could be formed.

Comparative Example 1

A resin-coated copper foil (resin layer thickness: 80 μm), multilayer copper-clad laminate and multilayer printed wiring board were produced in the same manner as in Example 1, except that use was made of a 7 μm thick electrolytic copper foil not furnished with any support copper foil, which had its rough side subjected to the same roughening treatment and passivation as in Example 1. The resin-coated copper foil was so extremely curled that the layup thereof was difficult, and suffered from cracking and resin peeling attributed to the curling. The multilayer copper-clad laminate had its surface wrinkled with the result that the formation of via holes with a diameter of 100 μm and wirings exhibiting a line width/line spacing=60 μm/60 μm was difficult.

What is claimed is:

1. A resin-coated composite foil comprising:
   a supporting metal layer,
   an organic release layer which is a nitrogen-containing compound and selected from the group consisting of carboxybenzotriazole and N',N'-bis (benzotriazolylmethyl) urea disposed on a surface of the supporting metal layer,
   an ultra-thin copper foil disposed on the organic release layer, and
   an organic insulation layer disposed on the ultra-thin copper foil, said organic insulation layer being formed from a resin composition consisting of:
   (i) an epoxy resin blend comprising an epoxy resin and a curing agent therefor, and
   (ii) a thermoplastic resin which is soluble in a solvent and has a functional group polymerizable with the epoxy resin and selected from the group consisting of a phenolic hydroxyl group, a carboxyl group and an amino group.

2. A resin-coated composite foil comprising:
   a supporting metal layer,
   an organic release layer which is a sulfur-containing compound and selected from the group consisting of thiocyanic acid and 2-benzimidazolethiol disposed on a surface of the supporting metal layer,
   an ultra-thin copper foil disposed on the organic release layer, and
   an organic insulation layer disposed on the ultra-thin copper foil, said organic insulation layer being formed from a resin composition consisting of:
   (i) an epoxy resin blend comprising an epoxy resin and a curing agent therefor, and
   (ii) a thermoplastic resin which is soluble in a solvent and has a functional group polymerizable with the epoxy resin and selected from the group consisting of a phenolic hydroxyl group, a carboxyl group and an amino group.

3. A resin-coated composite foil comprising:
   a supporting metal layer,
   an organic release layer which is a nitrogen-containing compound and selected from the group consisting of carboxybenzotriazole and N',N'-bis (benzotriazolylmethyl) urea disposed on a surface of the supporting metal layer,
   an ultra-thin copper foil disposed on the organic release layer, and
   an organic insulation layer disposed on the ultra-thin copper foil, said organic insulation layer being formed from a resin composition consisting of:
   (i) an epoxy resin blend comprising an epoxy resin and a curing agent therefor, and (ii) a thermoplastic resin which is soluble in a solvent and has a functional group polymerizable with the epoxy resin and selected from the group consisting of a polyvinyl acetal resin, a phenoxy resin and a polyether sulfone resin.

4. A resin-coated composite foil comprising:

a supporting metal layer, an organic release layer which is a sulfur-containing compound and selected from the group consisting of thiocyanic acid and 2-benzimidazolethiol disposed on a surface of the supporting metal layer, an ultra-thin copper foil disposed on the organic release layer, and an organic insulation layer disposed on the ultra-thin copper foil, said organic insulation layer being formed from a resin composition consisting of:

(i) an epoxy resin blend comprising an epoxy resin and a curing agent therefor, and (ii) a thermoplastic resin which is soluble in a solvent and has a functional group polymerizable with the epoxy resin and selected from the group consisting of a polyvinyl acetal resin, a phenoxy resin and a polyether sulfone resin.

* * * * *